(12) United States Patent
Albean

(10) Patent No.: US 6,639,422 B1
(45) Date of Patent: Oct. 28, 2003

(54) MULTI-CLOCK INTEGRATED CIRCUIT WITH CLOCK GENERATOR AND BI-DIRECTIONAL CLOCK PIN ARRANGEMENT

(75) Inventor: David Lawrence Albean, Indianapolis, IN (US)

(73) Assignee: Thomson Licensing S.A., Boulogne (FR)

( * ) Notice: Subject to any disclaimer, the term of this patent is extended or adjusted under 35 U.S.C. 154(b) by 29 days.

(21) Appl. No.: 10/069,199

(22) PCT Filed: Sep. 15, 2000

(86) PCT No.: PCT/US00/25485

§ 371 (c)(1), (2), (4) Date: Feb. 22, 2002

(87) PCT Pub. No.: WO01/20784

PCT Pub. Date: Mar. 22, 2001

Related U.S. Application Data

(60) Provisional application No. 60/154,098, filed on Sep. 15, 1999.

(51) Int. Cl.[7] .............................................. H03K 19/00
(52) U.S. Cl. .............................. 326/16; 326/93; 326/38
(58) Field of Search .............................. 326/16, 37, 38, 326/93–98

(56) References Cited

U.S. PATENT DOCUMENTS

| 4,293,870 A | 10/1981 | Steckler et al. ............... 358/10 |
| 5,495,422 A | 2/1996 | Olson ......................... 364/491 |
| 5,596,765 A | 1/1997 | Baum et al. ................. 395/800 |
| 5,677,877 A | 10/1997 | Yoon et al. ............. 365/189.02 |
| 5,686,844 A | 11/1997 | Hull et al. ..................... 326/38 |
| 5,752,077 A | 5/1998 | Yiu et al. ................... 395/827 |

FOREIGN PATENT DOCUMENTS

| EP | 0292099 | 11/1988 | ......... H03K/19/092 |
| JP | 2-119425 | 5/1990 | ....... H03K/19/0175 |
| JP | 4-123117 | 4/1992 | ............. G06F/1/06 |
| WO | 97/03444 | 1/1997 | ............. G11C/7/00 |
| WO | 99/31803 | 6/1999 | ....... H03K/19/0175 |

OTHER PUBLICATIONS

Patent Abstracts of Japan, vol. 016, No. 382, Aug. 14, 1992 & JP 4–123117 (see ref. AJ).
Patent Abstracts of Japan, vol. 014, No. 346, Jul. 26, 1990 and JP 2–119425 (see ref. AK).

*Primary Examiner*—Don Le
(74) *Attorney, Agent, or Firm*—Joseph S. Tripoli; Robert D. Shedd

(57) ABSTRACT

A multiple clock IC has a single, bi-directional clock I/O pin for each internally generated clock signal, with the functionality of each bi-directional clock I/O pin controllable to allow various modes of operation. Mode control of the clock I/O pins and associated circuitry/logic is preferably achieved via control signals supplied to I²C registers via an I²C bus/protocol system. The present invention allows for a normal mode of operation of the clocks, a debugging mode of operation for observation of the internal IC clocks, and/or a test mode of operation to drive the internal IC clock from the pin through the respective bi-directional I/O pin. The present invention is useful for both digital testing of the IC (when precise control over the test clock phase and timing is important) and for debugging. All of the modes of the IC clock signals are independently controllable.

20 Claims, 3 Drawing Sheets

| SEL1 | SEL2 | IN/OUT | MODE |
|---|---|---|---|
| 0 | 0 | 1 | NORMAL OPERATION - NO OUTPUT SIGNAL ON PAD, INTERNAL CLOCK IS OPERATING. |
| 0 | 0 | 0 | DEBUG MODE - OBSERVE INTERNAL CLOCK AT PAD. |
| 1 | 1 | 1 | DRIVE EXTERNAL CLOCK ON PAD. |

MULTI-CLOCK INTEGRATED CIRCUIT WITH CLOCK GENERATOR AND BI-DIRECTIONAL CLOCK PIN ARRANGEMENT

This application claims the benefit under 35 U.S.C. §365 of International Application PCT/US00//25485, filed Sep. 15, 2000, which was published in accordance with PCT Article 21(2) on Mar. 22, 2001 in English; and which claims benefit of U.S. provisional application Ser. no. 60/154,098 filed Sep. 15, 1999.

FIELD OF THE INVENTION

The present invention relates to integrated circuits that generate clock signals and, more particularly, to, integrated circuits that generate and utilize multiple clock signals.

BACKGROUND OF THE INVENTION

Integrated circuits (ICs) are extensively used in all types of electronic devices and/or systems. One characteristic of an IC's operation is the necessary utilization of a clock signal. The clock signal has particular frequency and determines, at least in part, the processing, execution, or state change speed of the IC. The clock signal may be provided to the IC from an external source or it is may be generated internally. When the clock signal is provided by an external source, it is of a particular frequency depending on the design characteristics of the particular IC. When the clock signal is generated internally, typically an external clock signal of a base frequency is provided to the IC which then converts the external clock signal of the base frequency into another usable clock signal frequency. Most ICs, however, utilize only one clock signal.

However, certain ICs used in electronic systems may require multiple clock signals to function properly. The multiple clock signals are typically generated on the IC from a single, externally generated clock signal input, rather than receiving multiple, externally generated clock signals. This reduces this number of pins/terminals on the IC for input clock signals which is important in integrated circuit design. An exemplary multiple clock IC as described above, known as a Universal Link IC, is used in a DTV-320 HDTV (High Definition Television) being developed by Thomson Consumer Electronics, Inc. of Indianapolis, Ind. The Universal Link IC may be used in other television signal processing devices.

The Universal Link IC is a mixed signal design (i.e. uses analog and digital signals) that integrates several signal processing functions. In general, the Universal Link IC contains a section for demodulating satellite signals, a section for demodulating HDTV signals, and a section that provides switching and chroma demodulation and other signal processing of NTSC television signal inputs. Each one of these sections requires a different clock frequency (i.e. a different clock signal). Other portions of the Universal Link IC may require even different clock signals. The Universal Link IC thus generates multiple clock signals as required for the various sections of the IC from a single, externally generated clock signal input via a clock input pin. In addition to the clock input pin, typical multiple clock ICs have an observation pin dedicated to each generated clock signal and a test pin dedicated to each generated clock signal.

Although multiple clock signals are necessary in some ICs, it is desirable to minimize the number of I/O (Input/Output) pins or terminals of the IC that are dedicated to clock generation, observation and testing thereof. This is because the number of available pins on an IC are limited and are usually needed for many other functions. However, it is also desirable to provide both observability of the internal clock signals being generated, e.g. for debugging purposes, and controllability of the clock signals, e.g. for testing purposes. Thus, there is contention between the number of available I/O pins for all of the needed IC functions and the need to reduce that number of I/O pins while retaining the functionality. External controllability is also desired since a Phase Locked Loop (PLL) synthesizer generally used in the internal generation of the various IC clock signals, is an analog circuit block.

What is therefore needed is a system, apparatus, and method that reduces the number of I/O pins for various aspects of clock functionality in a multiple clock IC.

What is further needed is a system, apparatus, and method that provides for both the minimization of the number of I/O pins dedicated to clock signals and adequate test capabilities of a multiple clock IC.

SUMMARY OF THE INVENTION

The present invention is an apparatus, system and method that has a single, bi-directional clock I/O pin for each internally generated clock signal of a multiple clock IC, with the functionality of each bi-directional clock I/O pin controllable to allow various modes of operation. Mode control of the clock I/O pins is preferably achieved via $I^2C$ registers in communication with an $I^2C$ bus/protocol system and a further I/O select pin.

The present invention allows for a normal mode of operation of the clocks, a debugging mode of operation for observation of the internal IC clocks, and/or a test mode of operation to drive the internal IC clock from the pin through the respective bi-directional I/O pin.

The present invention is useful for both digital testing of the IC (when precise control over the test clock phase and timing is important) and for debugging. For example, if the PLL synthesizer was non-functional, an external clock signal may be introduced in place of the normal internally generated clock signal. Thus, IC evaluation is possible even though the PLL may be inoperative.

Mode control of the clock I/O pins is controlled via control bits stored in the $I^2C$ register. In one embodiment, the register storing the control bits is coupled to a bus, such as an $I^2C$ serial bus and a bus master or slave sets the control bits by writing data to the register. The register may be memory mapped into the memory address space of the bus master device.

All of the modes of the IC clock signals are independently controllable. In particular, the three modes of operation of the clock I/O pins are: 1) Normal Mode—no internal clocks signal are output on the pins. If the IC is running properly, no clocks will be output on the respective I/O pin. The PLL and clock generator/divider will provide the plurality of internal IC clocks. It is also undesirable from an RFI standpoint to output clocks if not necessary so the clocks are not output on the I/O pads during normal operation.; 2) Test Mode—the PLL/clock generator/divider are bypassed and external test clock(s) are introduced onto the plurality of clock I/O pins. The I/O pins are acting as inputs. This allows full control of the clocks, since they are generated external to the IC and input into the IC.; and 3) Debug Mode—the internal clocks are output onto the plurality of clock I/O pins for observation. This mode is used to assess proper functionality of the PLL/clock generator/divider circuits.

The present invention is advantageous in that minimal IC I/O pins are required (i.e. only one I/O pin per internally generated clock). Further, the present invention allows either internally generated clocks (clock signals) or external clocks (clock signals) to clock the IC. Yet further, the present invention make it possible to observe internal clocks on the same set of I/O pins. Additionally, the present invention makes it possible to provide for automatic detection of mode of operation (e.g. test mode vs. normal functional mode of operation, and switch accordingly as disclosed in U.S. Pat. No. 5,517,109 entitled "Apparatus within an integrated circuit for automatically detecting a test mode of operation of the integrated circuit and selecting a test clock signal" by Albean el al., issued May 14, 1996, which is hereby specifically incorporated into the present specification by reference. Still further, the present invention In one form, the present invention is an apparatus in an integrated circuit. The apparatus includes a pin for coupling signals to and/or from the integrated circuit, a clock signal generator internal to the integrated circuit for producing a first clock signal, switching means responsive to a control signal, and control means for generating the control signal. The switching means is responsive to the control signal for providing: 1) a first mode of operation during which the first clock signal is utilized by a device internal to the integrated circuit and during which the first clock signal is not provided to the pin; 2) a second mode of operation during which the first clock signal is provided to the pin; and 3) a third mode of operation during which a second clock signal provided to the pin from a source external to the integrated circuit is utilized by the device internal to the integrated circuit.

In another form, the present invention is an integrated circuit. The integrated circuit includes a clock signal generator internal to the integrated circuit and operable to produce a plurality of clock signals, a pin associated with each one of the plurality of clock signals for coupling the respective clock signal to and/or from the integrated circuit, switch means associated with each one of the plurality of clock signals and responsive to a respective control signal, and a controller in communication with each switch means for generating the respective control signals. The switch means is responsive to the respective control signals to provide: a first mode of operation during which the respective clock signal is utilized by a device internal to the integrated circuit and during which the respective clock signal is not provided to the respective pin; a second mode of operation during which the respective clock signal is provided to the respective pin; and a third mode of operation during which an externally produced clock signal provided to the respective pin is utilized by the device internal to the integrated circuit; and In yet another form, the present invention is a method of controlling an integrated circuit including the steps of: generating a first clock signal internal to the integrated circuit, generating a control signal, and providing the control signal to a switch means in communication with a bi-directional pin. The switch means is responsive to the control signal to provide one mode of the following three modes: 1) a first mode of operation during which the first clock signal is utilized by a device internal to the integrated circuit and during which the first clock signal is not provided to the bi-directional pin; 2) a second mode of operation during which the first clock signal is provided to the bi-directional pin; and 3) a third mode of operation during which a second clock signal provided to the bi-directional pin from a source external to the integrated circuit is utilized by the device internal to the integrated circuit.

BRIEF DESCRIPTION OF THE DRAWINGS

Reference to the following description of the present invention should be taken in conjunction with the accompanying drawings, wherein.

Corresponding reference characters indicate corresponding parts throughout the several views.

DETAILED DESCRIPTION OF THE INVENTION

Figure 1:
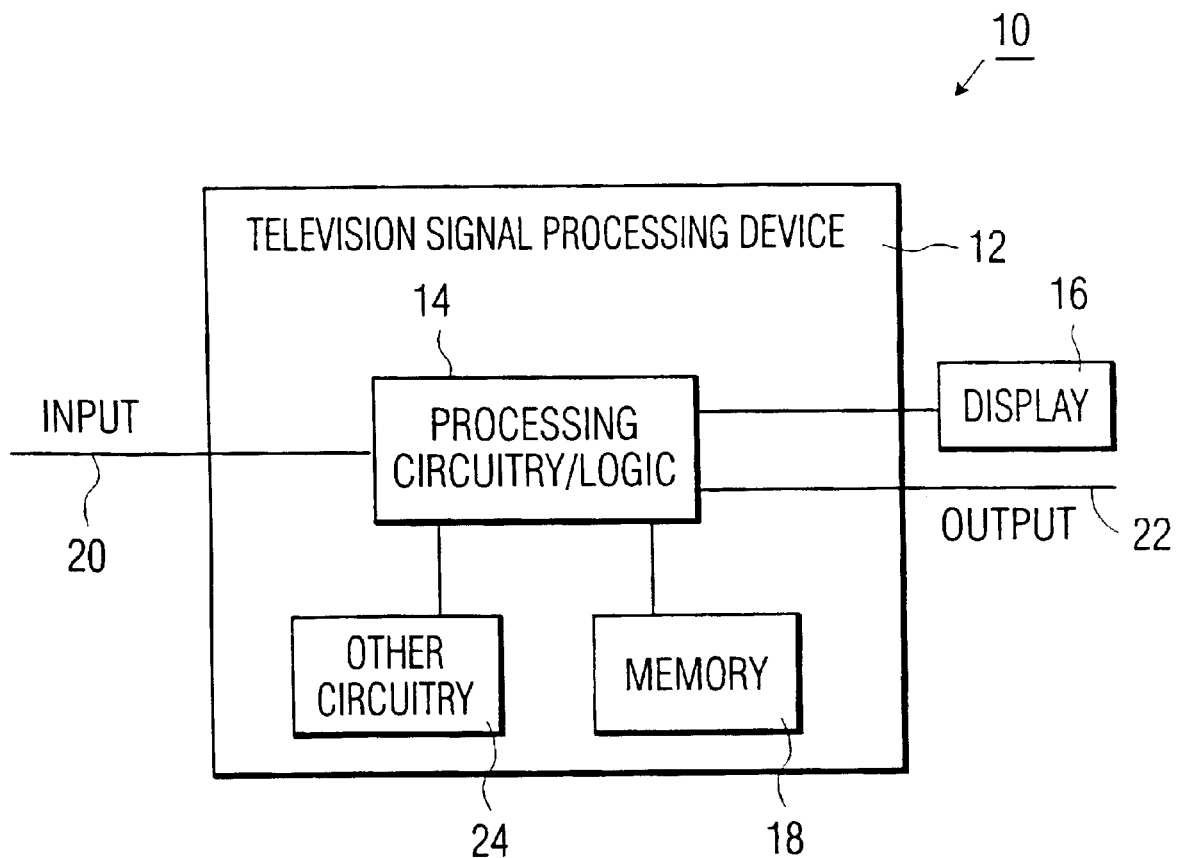
FIG. 1 is a block diagram of an exemplary system in which a multiple clock IC may be used.

With reference to FIG. 1 there is depicted a system, generally designated 10, that utilizes electricity and is composed at least in part of electrical circuitry, logic, and/or similar appropriate components. More specifically, the system 10 has a plurality of integrated circuits (ICs) for signal and/or data and information processing. Within the plurality of ICs of the system 10 is at least one IC whose proper functioning requires multiple clocks or clock/clocking signals. This type of IC may be termed a multiple clock IC. The present invention is utilized by this type of IC.

From the above it should be appreciated that the system 10 is only exemplary of an environment/application utilizing the present multiple clock IC. The multiple clock IC of the system 10, in accordance with the principles present herein, may take many forms and/or perform many functions. In the present exemplary case, the multiple clock IC is operable to provide television signal processing for a variety of formats of television signals from a variety of sources. Specifically, the present multiple clock, television signal processor IC incorporating the present invention is adapted/operable (i.e. includes appropriate circuitry/logic) to provide satellite television (digital) signal processing, terrestrial (including cable distribution) digital television signal processing, and terrestrial (including cable distribution) analog television signal processing in addition to other associated television signal processing. These analog and digital signals may be provided in various formats and modulation schemes. Of course, other types of ICs in which multiple clocks or clock signals are necessary may utilize the principles presented herein regardless of the IC's overall function/operation.

In one form, the system 10 includes a television signal processing device 12 such as a television apparatus, a set-top box, or the like. The television signal processing device 12 includes processing circuitry/logic 14 that receives a television signal via an input 20. The television signal may be digital or analog, and may be in any type of format and modulation scheme. The television signal processing device 12 also typically includes memory 18 in which is stored program instructions (i.e. software) for controlling the operation of the television signal processing device 12. Other circuitry/logic 24 is provided for other functionality of the television signal processing device 12 which represents all of the other necessary and/or appropriate circuitry/logic required for operation. Since the other circuitry/logic 24 is not necessary for understanding or practicing the present invention, it will not be described in detail.

The system 10 also includes a display 16 that is shown coupled to the processing circuitry/logic 14. The display 16 may be any type of display for showing the video portion of the television signal (and any OSD thereof) and may be integral to the television signal processing device, such as in a television, or may not be integral to the television signal processing device 12, such as in a set-top box or other television apparatus. In the case of set-top box or the like being the television signal processing device 12, the display 16 is associated with a television. An output 22 may also be provided to supply audio and/or video from the processed television signal to another device.

In one form, the television signal processing device 12 may be an analog/digital television, an all digital television such as a high definition digital television (HDTV), a set-top box capable of utilizing analog/digital television signals, a television signal storage device, or any other component that utilizes various forms of television signals. In the case of a television, the television signal processing apparatus 12 may be a model DTV-320 HDTV (High Definition Television) by Thomson Consumer Electronics, Inc. of Indianapolis, Ind. The television signal processing device 12 is also representative of any type of electronic device that may utilize a multiple clock integrated circuit (IC) or integrated circuit chip ("IC chip"). Thus, it should be appreciated that while a television signal processing device is discussed herein, the principles of the present invention may be applied to any type of multiple clock IC in any type of electronic device.

The signal source for the input 20 may be any type of television signal receptor/source such as a terrestrial antenna for digital and/or analog television signals, a direct broadcast-satellite (DBS) dish, a cable television system (CATV), or the like. Thus, the television signal may be digital or analog. The television signal typically includes a plurality of channels of audio and video information. As well, the television signal typically includes auxiliary data such as content ratings for the various programs on each channel. In the case of another type of device, the signal source may be any signal source.

The processing circuitry/logic 14 includes a number of integrated circuits (ICs) or IC chips each of which performs particular functions for the overall operation of the television signal processing device 12. Each IC is characterized by a plurality of Input/Output (I/O) pins or terminals. Many of the ICs of the processing circuitry/logic 14 perform a multitude of related functions, such as digital processing of various aspects of the input signal. As well, the ICs may perform analog processing of various aspects of the input signal. At least one of the plurality of ICs in the system 10 is a multiple clock IC. The multiple clock IC utilized in the processing circuitry/logic 14 of the television apparatus 12, is known as a Universal Link IC. The Universal Link IC is an integrated circuit chip of mixed signal design, i.e. both analog and digital signal processing circuitry, that incorporates or integrates several signal processing functions into a single IC chip or package. Hence, it should be appreciated that the Universal Link IC utilizes multiple clocks (i.e. clocks/clocking signals of different frequencies) for the various processing sections or blocks. The Universal Link IC is utilized in televisions, set-top boxes, and other similar devices that utilize/process television signals that may be analog and/or digital.

In general, the Universal Link IC includes a "Satlink" section for demodulating satellite television signals, a "VSB (Vestigal SideBand) link" section for demodulating HDTV signals (that can be any type of digital modulation link section), and a "DCD" section that provides switching, chroma demodulation, and other signal processing of NTSC (analog) signals. Thus, the Universal Link IC is utilized within the processing circuitry/logic 14 to perform a variety of functions and includes a plurality of I/O pins in the same manner as other ICs in an IC system or electronic circuitry. It should be understood that the depiction of a Universal Link IC is only representative of a multiple clock integrated circuit and that the principles presented herein are applicable to all types of multiple clock integrated circuits.

Figure 2:
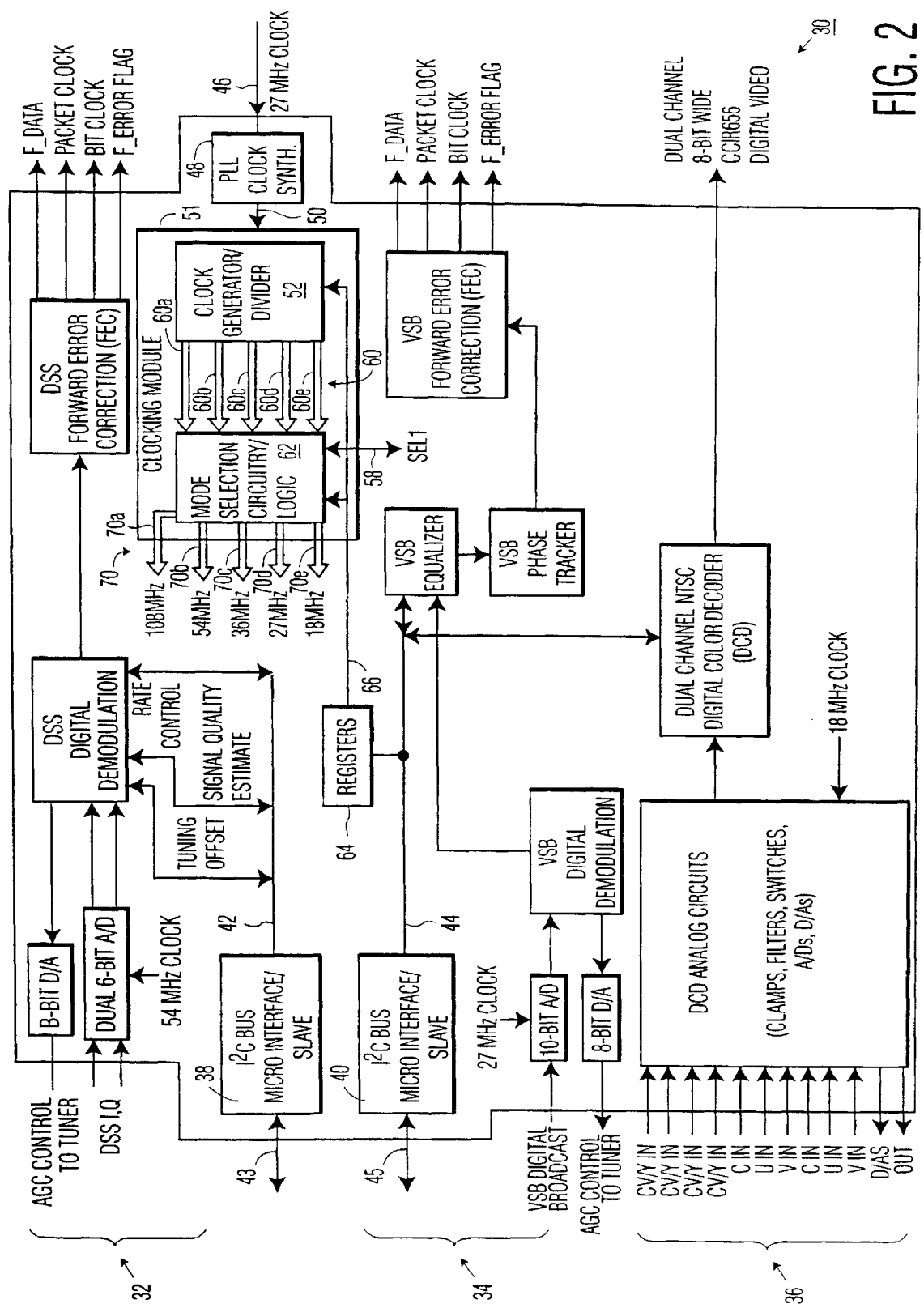
FIG. 2 is an upper level block diagram of a multiple clock IC, specifically a Universal Link IC utilized in the exemplary system of FIG. 1 incorporating an embodiment of the present invention in accordance with the principles disclosed herein.

Referring to FIG. 2, there is shown a top level block diagram of the Universal Link (UL) IC, generally designated 30, that includes an embodiment of the present invention in accordance with the principles presented herein. The UL IC 30 is an integrated circuit chip of mixed signal design, i.e. it includes analog signal processing circuitry/logic and digital signal processing circuitry/logic, for televisions, set-top boxes, and other similar devices that utilize/process analog and/or digital television signals. The UL IC 30 also requires a plurality of or multiple internal clock signals or clocks in order for the various sections to operate properly.

The Universal Link IC 30 includes three main sections, namely the "Satlink" section for demodulating satellite transmitted television signals, generally designated 32, the "VSB (Vestigal SideBand) link" section for demodulating terrestrially transmitted general digital and/or digital high definition (HDTV) signals (of which the HDTV signal can be modulated via any type of digital modulation scheme), generally designated 34, and the "DCD" section that provides switching, chroma demodulation, and other signal processing of NTSC (analog) signals, generally designated 36.

These sections 32, 34, and 36 operate independently and in parallel. External control of these three sections is accomplished via two $I^2C$ bus/micro interfaces or $I^2C$ slaves 38 and 40. The Universal Link IC 30 thus utilizes the $I^2C$ protocol/system to communicate with external components/ICs. The first $I^2C$ bus/micro interface 43 services the Satlink section 32 via a first internal bus 42. The first $I^2C$ bus/micro interface 38 is coupled to an I/O pin 43 such that the Satlink section 32 is in communication with an $I^2C$ bus structure of the system 10. The second $I^2C$ bus/micro interface 40 services the VSB section 34 and the DCD section 36 via a second internal bus 44. The second $I^2C$ bus/micro interface 40 is coupled to an I/O pin 45 such that the VSB and DCD sections 34 and 36 are in communication with the $I^2C$ bus structure of the system 10.

The Universal Link IC 30 includes an I/O pin 46 that accepts an externally generated reference clock signal. In the present example, the Universal Link IC requires a single, 27 MHz reference clock input. The 27 MHz reference clock signal is provided by a source of the system 10, external to the Universal Link IC 30. It should be appreciated that other ICs may require a different clock signal/frequency.

The reference clock signal on I/O pin 46 is received by a Phase Locked Loop (PLL) synthesizer module 48. The PLL synthesizer module 48 contains appropriate circuitry/logic to produce an output clock signal on an output/line 50. The PLL output clock signal, in the case of the present Universal Link IC 30, is 108 MHz. The 108 MHz clock signal is input to a clocking module 51 and, more particularly, to a clock generator/dividers module 52 of the clocking module 51. The clock generator/dividers module 52 contains appropriate circuitry/logic to divide the input PLL output clock signal received on line 50 into (or generate therefrom) a plurality of IC clock signals for clocking the various sections or blocks of circuitry/logic of the Universal Link IC 30. The actual number of IC clock signals produced by the clock generator/dividers 52 is dependent upon the clock signal requirements of the various sections or blocks of circuitry/logic of the particular IC. In the present case of the Universal Link IC 30, the clock generator/dividers 52 produces five (5) IC clock signals represented by outputs/lines 60a, 60b, 60c, 60d, and 60e. More specifically, the five output IC clock signals are 108 MHz, 54 MHz, 36 MHz, 27 MHz, and 18 MHz. The output/lines 60a–e also include an IN/OUT control signal or bit. This is set by the control bit in the register 64. The actual number of IC clock signals and their respective frequency may vary as indicated above.

In accordance with an aspect of the present invention, the multiple IC clock signals from the clock generator/dividers module 52 are input to a mode selection module 62 of the clocking module 51. The mode selection module 62 contains appropriate circuitry/logic to controllably permit various modes of operation with respect to each one of the IC clock signals and associated clock I/O pins. This is accomplished utilizing a single bi-directional I/O pin for each one of the IC clock signals produced by the clock generator/dividers module 52 and providing a means to control whether a particular I/O pin accepts data or transmits data therefrom. Such control is provided through the I$^2$C bus.

Thus, in the present case, five (5) bi-directional I/O pins are necessary, one I/O pin for each of the five (5) internally produced IC clock signals (i.e. clocking frequencies of 108 MHz, 54 MHz, 36 MHz, 27 MHz, and 18 MHz). Control of the mode of each IC clocking signal is provided via I$^2$C registers 64 that are in communication with the I$^2$C slave 40.

The mode selection module 62 includes a plurality of outputs associated with the plurality of IC clock signals. Particularly, the mode selection module 62 has three lines (inputs and/or outputs) per IC clock frequency, the IC clock signal, and IN/OUT control line (I/O pad 80 controller), and an I/O pad input line, all represented by the thick arrow. In FIG. 2, the lines for the five (5) IC clock signals of 108 MHz, 54 MHz, 36 MHz, 27 MHz, and 18 MHz are 70a, 70b, 70c, 70d, and 70e, respectively. As will be discussed further below, each triplet of lines per IC clock frequency includes an internal IC clock signal line, a bi-directional clock I/O pin line (collectively, clock I/O pin lines), and an IN/OUT or I/O pad control line. Each internal IC clock signal line provides an IC clock signal thereon to the appropriate circuitry/logic of the Universal Link IC 30. Each bi-directional clock I/O pin is operable to either accept an input clock signal applied thereto, or output an IC clock signal, depending on the IN/OUT line. The Universal Link IC 30 also includes a plurality of other I/O pins, some of which are labeled by text in FIG. 2.

The mode selection module 62 is operable, with respect to each IC clock signal from the clock generator/dividers module 52, to provide various modes of operation for the IC clock signals and with regard to each one of the plurality of clock I/O pins according to the control signals received by the mode selection module 62. The control signals and thus the various modes are selectable or controllable by a user or by the system 10 via software through the I$^2$C bus/protocol.

In particular, the various modes for each clock signal and associated I/O pin may be selectable via control bits stored in I$^2$C registers 64 as received through the I$^2$C slave 40 and communicated to the clocking module 51 (i.e. the mode selection module 62 and the clock generator/divider module 52). The I$^2$C registers 64 that store the control bits for each IC clocking signal section (i.e. the circuitry/logic for mode selection of a particular clocking signal and its associated I/O pin) is in communication with the I$^2$C bus/micro interface/slave 40 via the internal serial bus 44 (or other serial bus) and the mode selection module 62 and the clock generator/divider module 52 via bus or line 66. Thus the I$^2$C slave 40 can set the control bits on the register 64 for control of the particular IC clocking signal mode section by writing the control data (i.e. control bits) to the register 64. The register 64 may be memory mapped into the memory address space of the I$^2$C bus slave 40. The mode selection module 62 and the clock generator/divider module 52 reads or receives the control bits for a particular clocking signal mode section from the register 64 and puts the particular clocking signal mode section into the appropriate mode. The appropriate mode includes permitting or preventing data (i.e. clock signals) from being received and/or sent by the appropriate I/O pin and IC clock signal. In addition, an I/O pin 58 is used to provide a control signal for the SEL 1 line.

The mode selection module 62 is adapted to allow three modes of operation for each IC clocking signal section. A first mode of operation, that may be termed a "normal" mode, allows the internally generated IC clock signal to be provided to the appropriate circuitry/logic sections or blocks of the Universal Link IC 30, prevents the external output of the internally generated clock signal via its respective clock I/O pin, and does not accept input via the respective clock I/O pin. A second mode of operation, that may be termed a "test" mode, bypasses the internally generated IC clock signal, allows the respective I/O pin to receive an externally produced clock signal, and provides the externally produced clock signal to the appropriate circuitry/logic sections or blocks of the Universal Link IC 30. This mode is used to allow full control of the particular IC clock as the clock signal is generated externally of the IC and input thereto. A third mode of operation, that may be termed a debugging or debug mode, provides the internal IC clock to the respective I/O pin for external observation. This mode is used to assess proper functionality of the PLL 48 and the clock generator/dividers module 52.

Figures 3, 4:
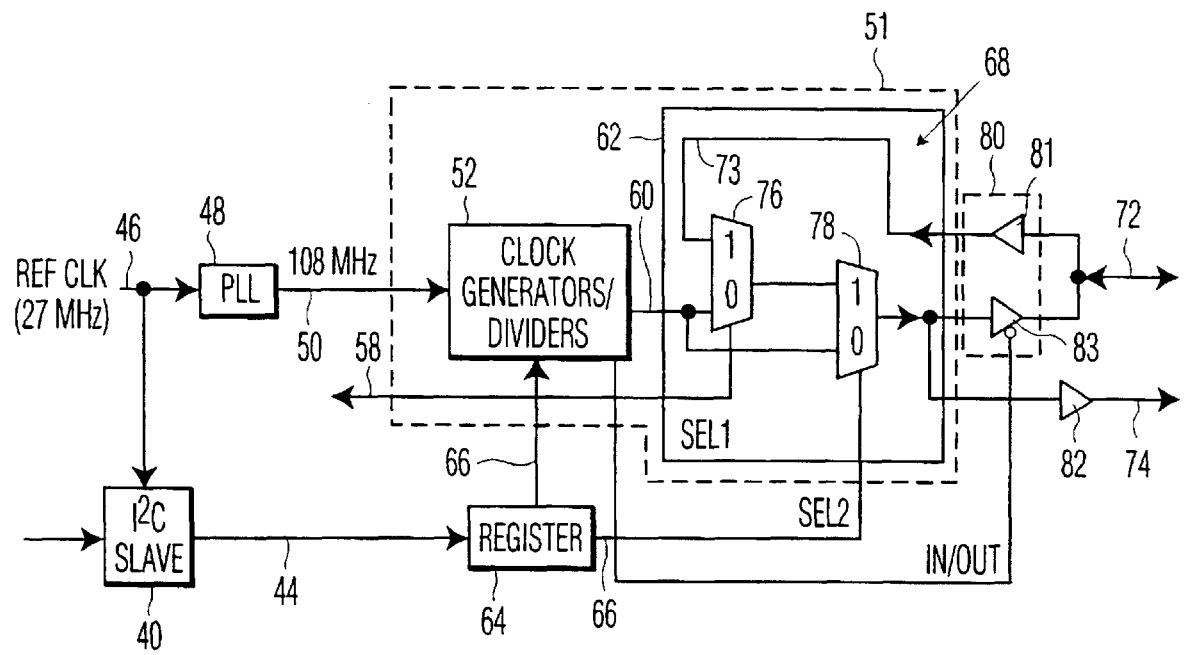
FIG. 3 is a block diagram of circuitry/logic for each generated clock signal of the Universal Link IC of FIG. 2 that provides a single I/O pin for each generated clock.
FIG. 4 is a logic truth table illustrating exemplary possible modes of operation of the circuitry/logic of FIG. 3.

Referring now to FIG. 3, there is depicted an exemplary IC clocking signal section mode control portion 68 of the mode selection module 62 of the clocking module 51 that is operable to control and provide the various modes of operation of one of the IC clock signals and its associated I/O pin. In the embodiment of FIG. 3, the IC clocking signal is arbitrarily assumed to be the 54 MHz clock signal. The mode control portion 68 includes appropriate circuitry/logic to provide the various modes of operation described herein including an associated I/O pin. It should be appreciated that there is one mode control portion per IC clock signal within the mode selection module 62. Thus, in the Universal Link IC 30 of FIG. 2, there are a total of five (5) mode control portions in the mode selection module 62. Therefore, it should be understood that although the below description pertains to only one mode selection portion 68 and thus only one IC clock signal, the below description is common and so applicable to the other mode selection portions associated with the other IC clock signals.

In particular and still referring to FIG. 3, the clock generator 52 produces a clock signal that is output on line 60. For this example, the IC clock signal is the 54 MHz clock signal. The output clock signal is fed into a first input (labeled "0") of a first multiplexer 76 and a first input (labeled "0") of a second multiplexer 78. A second input (labeled "1") of the first multiplexer 76 is coupled to an input line 73 from a one-way buffer/diode 81 of a I/O pad 80. The I/O pad 80 (external to the clocking module 51) provides an interface between the remaining portion of the mode control portion 68 and the bi-directional I/O clock pin 72. The second input (labeled "1") of the first multiplexer 76 receives an input via the I/O pin 72 when the I/O pad 80 is in a receiving mode. The output of the first multiplexer 76 is input into a second input (labeled "1") of the second multiplexer 78. The output of the second multiplexer 78 is routed through a one-way buffer 82 to an internal IC clock line 74. The internal IC clock line 74 supplies the clock signal thereon to the appropriate circuitry/logic of the Universal Link IC 30.

The first multiplexer 76 has a control line labeled SEL 1 that is coupled to an I/O pin 58 known as the "clock_mode" pin. The SEL 1 control line is coupled to a control input of the first multiplexer 76 and is operable to transmit a control bit (i.e. control data) from an external controller to the first multiplexer 76 to control or select the output of the first multiplexer 76. The output of the first multiplexer 76 is either the IC clock signal provided on input "0" by the clock generator/dividers 52, or the clock signal on input "1" provided by an external clock signal on the clock I/O pin 72.

The second multiplexer 78 has a control line labeled SEL 2 that is coupled to the register 64. The SEL 2 control line is coupled to a control input of the second multiplexer 78 and is operable to transmit a control bit (i.e. control data) from the register 64 to the second multiplexer 78 to control or select the output of the second multiplexer 78. The output of the second multiplexer 78 is either the IC clock signal provided on input "0" by the clock generator/dividers 52, or the output of the first multiplexer 76.

A control portion of the I/O pad 80 is coupled to the clock generator module 52 via an IN/OUT control line. The IN/OUT control line is operable to provide a control signal to the I/O pad 80 that allows or blocks external signals on the I/O pin 72 from going through a one-way buffer 81 and to the input "1" of the first multiplexer 76. The IN/OUT control line is also operable to provide a control signal to the I/O pad 80 that allows or blocks the signal outputted from the second multiplexer 78 from being provided to the I/O pin 72. The IN/OUT signal is received by the clock generator module 52 via the register 64. In all cases, the internal IC clock line 74 receives and transmits the output of the second multiplexer 78.

Thus, for each clocking signal and associated I/O pin, there is a mode control portion 68. The register(s) 64 must provide SEL 2 (directly) and IN/OUT (indirectly), control signals for each mode control portion 68, while the SEL 1 control signal is provided by an external controller coupled to the SEL 1 I/O pin 58. The control signals are provided to the register(s) 64 via the I²C slave 40 via the I²C bus/protocol. The control signals may be provided by a program or software via the I²C bus/protocol or by a user.

An exemplary truth table, generally designated 90, is depicted in FIG. 4 for the mode control section 68 and attention is now directed thereto. The truth table 90 will be described in conjunction with FIG. 3. The truth table 90 shows the mode of operation of the mode select section 68 depending on the particular control signal (which is designated by a row 92, 94, and 96), received from the register 64 by the mode selection module 62. It should be appreciated that the control signals discussed with reference to the truth table 90 and FIG. 3, pertain to the general operation of an IC clocking signal mode select section. Other control signals are provided to select which IC clocking signal mode select section receives the general operation control signals.

A control signal of "001" corresponding to row 92, puts the mode select portion 68 in the normal operation mode. The SEL 1 line provides a "0" to the first multiplexer 76 so that the input "0" is selected for the output of the first multiplexer 76. Thus, the first multiplexer 76 outputs the IC clock signal as the input "1" of the second multiplexer 78. The SEL 2 line provides a "0" to the second multiplexer 78 so that the input "0" is selected for the output of the second multiplexer 78. Thus, the second multiplexer 78 outputs the IC clock signal as provided on the input "0" of the second multiplexer 78. Because the output of the second multiplexer 78 is provided to the internal IC clock output 74, the internally generated clock is internally provided to the appropriate integrated circuit sections of the Universal Link IC 30. The I/O pad 80 is provided a "1" by the IN/OUT line which causes the buffer 83 to not allow the incoming signal to be outputted on the I/O pin 72. It should be noticed that regardless of the state of the IN/OUT signal, the first and second multiplexers 76 and 78 will not select what is on line 73 unless a control signal of "1" is provided to the SEL 1 control line.

A control signal of "000" corresponding to row 94, puts the mode select portion 68 in the debug mode. The SEL 1 line provides a ion to the first multiplexer 76 so that the input "0" is selected for the output of the first multiplexer 76. Thus, the first multiplexer 76 outputs the IC clock signal as the input "1" of the second multiplexer 78. The SEL 2 line provides a "0" to the second multiplexer 78 so that the input "0" is selected for the output of the second multiplexer 78. Thus, the second multiplexer 78 outputs the IC clock signal as provided on the input "0" of the second multiplexer 78. Because the output of the second multiplexer 78 is provided to the internal IC clock output 74, the internally generated clock is internally provided to the appropriate integrated circuit sections of the Universal Link IC 20. The I/O pad 80 is provided a "0" by the IN/OUT line which causes the buffer 83 to allow the incoming signal to be outputted on the I/O pin 72. It should be noticed that regardless of the state of the IN/OUT signal, the first and second multiplexers 76 and 78 will not select what is on line 73 unless a control signal of "1" is provided by the SEL 1 control line.

A control signal of "111" corresponding to row 96, puts the mode select portion 68 in the test mode. The SEL 1 line provides a "1" to the first multiplexer 76 so that the input "1" is selected for the output of the first multiplexer 76. Thus, the first multiplexer 76 outputs the signal on the I/O pad 80 and specifically the I/O pin 72 as the input "1" of the second multiplexer 78. The SEL 2 line provides a "1" to the second multiplexer 78 so that the input "1" is selected for the output of the second multiplexer 78. Thus, the second multiplexer 78 outputs the signal on the I/O pad 80 and specifically the I/O pin 72 as provided on the input "1" of the second multiplexer 78. Because the output of the second multiplexer 78 is provided to the internal IC clock output 74, the externally generated clock is internally provided to the appropriate integrated circuit sections of the Universal Link IC 20. The I/O pad 80 is provided a "1" by the IN/OUT line which causes the buffer 83 to prevent the incoming signal from being outputted on the I/O pin 72. Instead, the buffer 81 receives any signal on the I/O pin 72. This signal would be an external clock signal.

In accordance with an aspect of the present invention, each of the individual or particular clock mode control portions for the internally produced IC clock signals are independently controllable. Thus, the 54 MHz IC clock signal could be the internally generated clock, while the 18 MHz IC clock could be input as an external clock. Many other combinations are possible. Independent control of each clock mode control section allows maximum flexibility during debug and testing of the IC.

While this invention has been described as having a preferred design and/or configuration, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. In an integrated circuit, an apparatus comprising:
    a pin for coupling signals to and/or from the integrated circuit;
    a clock signal generator internal to the integrated circuit for producing a first clock signal;
    switching means responsive to a control signal for providing:
        1) a first mode of operation during which the first clock signal is utilized by a device internal to the integrated circuit and during which the first clock signal is not provided to the pin;
        2) a second mode of operation during which the first clock signal is provided to the pin; and
        3) a third mode of operation during which a second clock signal provided to the pin from a source external to the integrated circuit is utilized by the device internal to the integrated circuit; and
    control means for generating the control signal.

2. The apparatus of claim 1, wherein the clock signal generator comprises a PLL adapted to receive an external reference clock signal, and a clock divider coupled to an output of the PLL.

3. The apparatus of claim 1, wherein the switching means comprises:
    first and second multiplexers; and
    an I/O pad in communication with the pin.

4. The apparatus of claim 3, wherein the control signal comprises control bits for the first and second multiplexers and the I/O pad.

5. The apparatus of claim 1, wherein the control means is programmable to generate the control signal.

6. The apparatus of claim 4, wherein the control means is programmable to generate the control signal via an I²C bus/protocol system.

7. The apparatus of claim 1, wherein the first, second, and third modes of operation are mutually exclusive.

8. An integrated circuit comprising:
    a clock signal generator internal to the integrated circuit and operable to produce a plurality of clock signals;
    a pin associated with each one of the plurality of clock signals for coupling the respective clock signal to and/or from the integrated circuit;
    switch means associated with each one of the plurality of clock signals and responsive to a respective control signal to provide:
        a first mode of operation during which the respective clock signal is utilized by a device internal to the integrated circuit and during which the respective clock signal is not provided to the respective pin;
        a second mode of operation during which the respective clock signal is provided to the respective pin; and
        a third mode of operation during which an externally produced clock signal provided to the respective pin is utilized by the device internal to the integrated circuit; and
    a controller in communication with each switch means for generating the respective control signals.

9. The integrated circuit of claim 8, wherein the clock signal generator comprises a PLL adapted to receive an external reference clock signal, and a clock divider coupled to an output of the PLL.

10. The integrated circuit of claim 8, wherein each switch means comprises:
    first and second multiplexers; and
    an I/O pad in communication with the respective pin.

11. The integrated circuit of claim 10, wherein the respective control signal comprises control bits for the respective first and second multiplexers and the respective I/O pad.

12. The integrated circuit of claim 8, wherein the controller is programmable to generate the control signals.

13. The integrated circuit of claim 12, wherein the controller is programmable to generate the control signals via an I²C bus/protocol system.

14. The integrated circuit of claim 8, wherein the first, second, and third modes of operation are mutually exclusive.

15. The integrated circuit of claim 8, wherein each switch means is operable in response to the respective control signal independent of each other switch means.

16. A method of controlling an integrated circuit comprising:
    generating a first clock signal internal to the integrated circuit;
    generating a control signal; and
    providing the control signal to a switch means in communication with a bi-directional pin, the switch means responsive to the control signal to provide one mode of the following three modes:
        1) a first mode of operation during which the first clock signal is utilized by a device internal to the integrated circuit and during which the first clock signal is not provided to the bi-directional pin;
        2) a second mode of operation during which the first clock signal is provided to the bi-directional pin; and
        3) a third mode of operation during which a second clock signal provided to the bi-directional pin from a source external to the integrated circuit is utilized by the device internal to the integrated circuit.

17. The method of claim 16, wherein the first clock signal is generated by PLL adapted to receive an external reference clock signal, and a clock divider coupled to an output of the PLL.

18. The method of claim 16, wherein the switch means is responsive to the control signal by first and second multiplexers, and an I/O pad in communication with the bi-directional pin.

19. The method of claim 18, wherein the step of generating a control signal comprises generating control bits for the first and second multiplexers and the I/O pad.

20. The method of claim 16, wherein the step of generating a control signal programmable.

* * * * *